(12) United States Patent
Campbell et al.

(10) Patent No.: US 6,867,064 B2
(45) Date of Patent: Mar. 15, 2005

(54) METHOD TO ALTER CHALCOGENIDE GLASS FOR IMPROVED SWITCHING CHARACTERISTICS

(75) Inventors: Kristy A. Campbell, Boise, ID (US); John Moore, Boise, ID (US); Terry L. Gilton, Boise, ID (US); Joseph F. Brooks, Nampa, ID (US)

(73) Assignee: Micron Technology, Inc., Boise, ID (US)

( * ) Notice: Subject to any disclaimer, the term of this patent is extended or adjusted under 35 U.S.C. 154(b) by 246 days.

(21) Appl. No.: 10/075,390

(22) Filed: Feb. 15, 2002

(65) Prior Publication Data

US 2003/0155606 A1 Aug. 21, 2003

(51) Int. Cl.$^7$ ............................................... H01L 21/00
(52) U.S. Cl. ........................ 438/95; 438/102; 438/308; 438/795
(58) Field of Search ........................ 438/95, 102, 103, 438/238, 308, 795; 365/148

(56) References Cited

U.S. PATENT DOCUMENTS

| 3,271,591 A | 9/1966 | Ovshinsky |
| 3,622,319 A | 11/1971 | Sharp |
| 3,743,847 A | 7/1973 | Boland |
| 3,961,314 A | 6/1976 | Klose et al. |
| 3,966,317 A | 6/1976 | Wacks et al. |
| 3,983,542 A | 9/1976 | Ovshinsky |
| 3,988,720 A | 10/1976 | Ovshinsky |

(List continued on next page.)

FOREIGN PATENT DOCUMENTS

| JP | 56126916 | 10/1981 |
| WO | WO 97/48032 | 12/1997 |
| WO | WO 99/28914 | 6/1999 |
| WO | WO 00/48196 | 8/2000 |
| WO | WO 02/21542 | 3/2002 |

OTHER PUBLICATIONS

Axon Technologies Corporation, Technology Description: *Programmable Metalization Cell(PMC)*, pp. 1–6 (Pre–May 2000).

Helbert et al., *Intralevel hybrid resist process with submicron capability*, SPIE vol. 333 Submicron Lithography, pp. 24–29 (1982).

Hilt, Dissertation: *Materials characterization of Silver Chalcogenide Programmable Metalization Cells*, Arizona State University, pp. Title page–114 (UMI Company, May 1999).

Hirose et al., *High Speed Memory Behavior and Reliability of an Amorphous $As_2S_3$ Film Doped Ag*, Phys. Stat. Sol. (a) 61, pp. 87–90 (1980).

Holmquist et al., *Reaction and Diffusion in Silver–Arsenic Chalcogenide Glass Systems*, 62 J. Amer. Ceram. Soc., No. 3–4, pp. 183–188 (Mar.–Apr. 1979).

(List continued on next page.)

*Primary Examiner*—Tom Thomas
*Assistant Examiner*—N. Drew Richards
(74) *Attorney, Agent, or Firm*—Dickstein Shapiro Morin & Oshinsky LLP

(57) ABSTRACT

The present invention is related to methods of fabricating a resistance variable memory element and a device formed therefrom having improved switching characteristics. According to an embodiment of the present invention a resistance variable material memory element is annealed to remove stoichiometric amounts of a component of the resistance variable material. According to another embodiment of the present invention a silver-germanium-selenide glass is annealed for a duration of about 10 minutes in the presence of oxygen to drive off selenium and increase the rigidity of the glass.

30 Claims, 3 Drawing Sheets

U.S. PATENT DOCUMENTS

| | | | |
|---|---|---|---|
| 4,177,474 A | | 12/1979 | Ovshinsky |
| 4,267,261 A | | 5/1981 | Hallman et al. |
| 4,269,935 A | | 5/1981 | Masters et al. |
| 4,312,938 A | | 1/1982 | Drexler et al. |
| 4,316,946 A | | 2/1982 | Masters et al. |
| 4,320,191 A | | 3/1982 | Yoshikawa et al. |
| 4,405,710 A | | 9/1983 | Balasubramanyam et al. |
| 4,419,421 A | | 12/1983 | Wichelhaus et al. |
| 4,499,557 A | | 2/1985 | Holmberg et al. |
| 4,597,162 A | | 7/1986 | Johnson et al. |
| 4,608,296 A | | 8/1986 | Keem et al. |
| 4,637,895 A | | 1/1987 | Ovshinsky et al. |
| 4,646,266 A | | 2/1987 | Ovshinsky et al. |
| 4,664,939 A | | 5/1987 | Ovshinsky |
| 4,668,968 A | | 5/1987 | Ovshinsky et al. |
| 4,670,763 A | | 6/1987 | Ovshinsky et al. |
| 4,671,618 A | | 6/1987 | Wu et al. |
| 4,673,957 A | | 6/1987 | Ovshinsky et al. |
| 4,678,679 A | | 7/1987 | Ovshinsky |
| 4,696,758 A | | 9/1987 | Ovshinsky et al. |
| 4,698,234 A | | 10/1987 | Ovshinsky et al. |
| 4,710,899 A | | 12/1987 | Young et al. |
| 4,728,406 A | | 3/1988 | Banerjee et al. |
| 4,737,379 A | | 4/1988 | Hudgens et al. |
| 4,766,471 A | | 8/1988 | Ovshinsky et al. |
| 4,769,338 A | | 9/1988 | Ovshinsky et al. |
| 4,775,425 A | | 10/1988 | Guha et al. |
| 4,788,594 A | | 11/1988 | Ovshinsky et al. |
| 4,795,657 A | | 1/1989 | Formigoni et al. |
| 4,800,526 A | | 1/1989 | Lewis |
| 4,804,490 A | * | 2/1989 | Pryor et al. ................ 438/796 |
| 4,809,044 A | | 2/1989 | Pryor et al. |
| 4,818,717 A | | 4/1989 | Johnson et al. |
| 4,843,443 A | | 6/1989 | Ovshinsky et al. |
| 4,845,533 A | | 7/1989 | Pryor et al. |
| 4,847,674 A | | 7/1989 | Sliwa et al. |
| 4,853,785 A | | 8/1989 | Ovshinsky et al. |
| 4,891,330 A | | 1/1990 | Guha et al. |
| 4,920,078 A | * | 4/1990 | Bagley et al. ............... 438/779 |
| 5,128,099 A | | 7/1992 | Strand et al. |
| 5,159,661 A | | 10/1992 | Ovshinsky et al. |
| 5,166,758 A | | 11/1992 | Ovshinsky et al. |
| 5,177,567 A | | 1/1993 | Klersy et al. |
| 5,219,788 A | | 6/1993 | Abernathey et al. |
| 5,238,862 A | | 8/1993 | Blalock et al. |
| 5,272,359 A | | 12/1993 | Nagasubramanian et al. |
| 5,296,716 A | | 3/1994 | Ovshinsky et al. |
| 5,314,772 A | | 5/1994 | Kozicki |
| 5,315,131 A | | 5/1994 | Kishimoto et al. |
| 5,330,630 A | * | 7/1994 | Klersy et al. .......... 204/192.25 |
| 5,335,519 A | | 8/1994 | Bernier |
| 5,341,328 A | | 8/1994 | Ovshinsky et al. |
| 5,350,484 A | | 9/1994 | Gardner et al. |
| 5,359,205 A | | 10/1994 | Ovshinsky |
| 5,360,981 A | | 11/1994 | Owen et al. |
| 5,406,509 A | | 4/1995 | Ovshinsky et al. |
| 5,414,271 A | | 5/1995 | Ovshinsky et al. |
| 5,500,532 A | | 3/1996 | Kozicki et al. |
| 5,512,328 A | | 4/1996 | Yoshimura et al. |
| 5,512,773 A | | 4/1996 | Wolf et al. |
| 5,534,711 A | | 7/1996 | Ovshinsky et al. |
| 5,534,712 A | | 7/1996 | Ovshinsky et al. |
| 5,536,947 A | | 7/1996 | Klersy et al. |
| 5,543,737 A | | 8/1996 | Ovshinsky |
| 5,591,501 A | | 1/1997 | Ovshinsky et al. |
| 5,596,522 A | | 1/1997 | Ovshinsky et al. |
| 5,687,112 A | | 11/1997 | Ovshinsky |
| 5,694,054 A | | 12/1997 | Ovshinsky et al. |
| 5,714,768 A | | 2/1998 | Ovshinsky et al. |
| 5,726,083 A | | 3/1998 | Takaishi |
| 5,751,012 A | | 5/1998 | Wolstenholme et al. |
| 5,761,115 A | | 6/1998 | Kozicki et al. |
| 5,789,277 A | | 8/1998 | Zahorik et al. |
| 5,814,527 A | | 9/1998 | Wolstenholme et al. |
| 5,818,749 A | | 10/1998 | Harshfield |
| 5,825,046 A | | 10/1998 | Czubatyj et al. |
| 5,837,564 A | | 11/1998 | Sandhu et al. |
| 5,841,150 A | | 11/1998 | Gonzalez et al. |
| 5,846,889 A | | 12/1998 | Harbison et al. |
| 5,851,882 A | | 12/1998 | Harshfield |
| 5,869,843 A | | 2/1999 | Harshfield |
| 5,896,312 A | | 4/1999 | Kozicki et al. |
| 5,912,839 A | | 6/1999 | Ovshinsky et al. |
| 5,914,893 A | | 6/1999 | Kozicki et al. |
| 5,920,788 A | | 7/1999 | Reinberg |
| 5,933,365 A | * | 8/1999 | Klersy et al. ................ 365/148 |
| 5,998,066 A | | 12/1999 | Block et al. |
| 6,011,757 A | | 1/2000 | Ovshinsky |
| 6,031,287 A | | 2/2000 | Harshfield |
| 6,072,716 A | | 6/2000 | Jacobson et al. |
| 6,077,729 A | | 6/2000 | Harshfield |
| 6,084,796 A | | 7/2000 | Kozicki et al. |
| 6,087,674 A | | 7/2000 | Ovshinsky et al. |
| 6,117,720 A | | 9/2000 | Harshfield |
| 6,141,241 A | | 10/2000 | Ovshinsky et al. |
| 6,143,604 A | | 11/2000 | Chiang et al. |
| 6,177,338 B1 | | 1/2001 | Liaw et al. |
| 6,236,059 B1 | | 5/2001 | Wolstenholme et al. |
| RE37,259 E | | 7/2001 | Ovshinsky |
| 6,297,170 B1 | | 10/2001 | Gabriel et al. |
| 6,300,684 B1 | | 10/2001 | Gonzalez et al. |
| 6,316,784 B1 | | 11/2001 | Zahorik et al. |
| 6,329,606 B1 | | 12/2001 | Freyman et al. |
| 6,339,544 B1 | | 1/2002 | Chiang et al. |
| 6,348,365 B1 | | 2/2002 | Moore et al. |
| 6,350,679 B1 | | 2/2002 | McDaniel et al. |
| 6,376,284 B1 | | 4/2002 | Gonzalez et al. |
| 6,388,324 B2 | | 5/2002 | Kozicki et al. |
| 6,391,688 B1 | | 5/2002 | Gonzalez et al. |
| 6,404,665 B1 | | 6/2002 | Lowery et al. |
| 6,414,376 B1 | | 7/2002 | Thakur et al. |
| 6,418,049 B1 | | 7/2002 | Kozicki et al. |
| 6,423,628 B1 | | 7/2002 | Li et al. |
| 6,429,064 B1 | | 8/2002 | Wicker |
| 6,437,383 B1 | | 8/2002 | Xu |
| 6,440,837 B1 | | 8/2002 | Harshfield |
| 6,462,984 B1 | | 10/2002 | Xu et al. |
| 6,469,364 B1 | | 10/2002 | Kozicki |
| 6,473,332 B1 | | 10/2002 | Ignatiev et al. |
| 6,480,438 B1 | | 11/2002 | Park |
| 6,487,106 B1 | | 11/2002 | Kozicki |
| 6,487,113 B1 | | 11/2002 | Park et al. |
| 6,501,111 B1 | | 12/2002 | Lowery |
| 6,507,061 B1 | | 1/2003 | Hudgens et al. |
| 6,511,862 B2 | | 1/2003 | Hudgens et al. |
| 6,511,867 B2 | | 1/2003 | Lowery et al. |
| 6,512,241 B1 | | 1/2003 | Lai |
| 6,514,805 B2 | | 2/2003 | Xu et al. |
| 6,531,373 B2 | | 3/2003 | Gill et al. |
| 6,534,781 B2 | | 3/2003 | Dennison |
| 6,545,287 B2 | | 4/2003 | Chiang |
| 6,545,907 B1 | | 4/2003 | Lowery et al. |
| 6,555,860 B2 | | 4/2003 | Lowery et al. |
| 6,563,164 B2 | | 5/2003 | Lowery et al. |
| 6,566,700 B2 | | 5/2003 | Xu |
| 6,567,293 B1 | | 5/2003 | Lowery et al. |
| 6,569,705 B2 | | 5/2003 | Chiang et al. |
| 6,570,784 B2 | | 5/2003 | Lowery |
| 6,576,921 B2 | | 6/2003 | Lowery |
| 6,586,761 B2 | | 7/2003 | Lowery |

| | | |
|---|---|---|
| 6,589,714 B2 | 7/2003 | Maimon et al. |
| 6,590,807 B2 | 7/2003 | Lowery |
| 6,593,176 B2 | 7/2003 | Dennison |
| 6,597,009 B2 | 7/2003 | Wicker |
| 6,605,527 B2 | 8/2003 | Dennison et al. |
| 6,613,604 B2 | 9/2003 | Maimon et al. |
| 6,621,095 B2 | 9/2003 | Chiang et al. |
| 6,625,054 B2 | 9/2003 | Lowery et al. |
| 6,642,102 B2 | 11/2003 | Xu |
| 6,646,297 B2 | 11/2003 | Dennison |
| 6,649,928 B2 | 11/2003 | Dennison |
| 6,667,900 B2 | 12/2003 | Lowery et al. |
| 6,671,710 B2 | 12/2003 | Ovshinsky et al. |
| 6,673,700 B2 | 1/2004 | Dennison et al. |
| 6,674,115 B2 | 1/2004 | Hudgens et al. |
| 6,687,153 B2 | 2/2004 | Lowery |
| 6,687,427 B2 | 2/2004 | Ramalingam et al. |
| 6,690,026 B2 | 2/2004 | Peterson |
| 6,696,355 B2 | 2/2004 | Dennison |
| 6,707,712 B2 | 3/2004 | Lowery |
| 6,714,954 B2 | 3/2004 | Ovshinsky et al. |
| 2002/0000666 A1 | 1/2002 | Kozicki et al. |
| 2002/0072168 A1 | 6/2002 | Gilton |
| 2002/0106849 A1 | 8/2002 | Moore |
| 2002/0123169 A1 | 9/2002 | Moore et al. |
| 2002/0123170 A1 | 9/2002 | Moore et al. |
| 2002/0123248 A1 | 9/2002 | Moore et al. |
| 2002/0127886 A1 | 9/2002 | Moore et al. |
| 2002/0132417 A1 | 9/2002 | Li |
| 2002/0160551 A1 | 10/2002 | Harshfield |
| 2002/0163828 A1 | 11/2002 | Krieger et al. |
| 2002/0168820 A1 | 11/2002 | Kozicki et al. |
| 2002/0168852 A1 | 11/2002 | Harshfield et al. |
| 2002/0190289 A1 | 12/2002 | Harshfield et al. |
| 2002/0190350 A1 | 12/2002 | Kozicki |
| 2003/0001229 A1 | 1/2003 | Moore et al. |
| 2003/0027416 A1 | 2/2003 | Moore |
| 2003/0032254 A1 | 2/2003 | Gilton |
| 2003/0035314 A1 | 2/2003 | Kozicki |
| 2003/0035315 A1 | 2/2003 | Kozicki |
| 2003/0038301 A1 | 2/2003 | Moore |
| 2003/0043631 A1 | 3/2003 | Gilton et al. |
| 2003/0045049 A1 | 3/2003 | Campbell et al. |
| 2003/0045054 A1 | 3/2003 | Campbell et al. |
| 2003/0047765 A1 | 3/2003 | Campbell |
| 2003/0047772 A1 | 3/2003 | Li |
| 2003/0047773 A1 | 3/2003 | Li |
| 2003/0048519 A1 | 3/2003 | Kozicki |
| 2003/0048744 A1 | 3/2003 | Ovshinsky et al. |
| 2003/0049912 A1 | 3/2003 | Campbell et al. |
| 2003/0068861 A1 | 4/2003 | Li |
| 2003/0068862 A1 | 4/2003 | Li |
| 2003/0095426 A1 | 5/2003 | Hush et al. |
| 2003/0096497 A1 * | 5/2003 | Moore et al. ............... 438/652 |
| 2003/0107105 A1 * | 6/2003 | Kozicki ...................... 257/529 |
| 2003/0117831 A1 | 6/2003 | Hush |
| 2003/0128612 A1 | 7/2003 | Moore et al. |
| 2003/0137869 A1 | 7/2003 | Kozicki |
| 2003/0143782 A1 | 7/2003 | Gilton et al. |
| 2003/0155589 A1 | 8/2003 | Campbell et al. |
| 2003/0155606 A1 | 8/2003 | Campbell et al. |
| 2003/0156447 A1 | 8/2003 | Kozicki |
| 2003/0156463 A1 | 8/2003 | Casper et al. |
| 2003/0209728 A1 | 11/2003 | Kozicki et al. |
| 2003/0209971 A1 | 11/2003 | Kozicki et al. |
| 2003/0210564 A1 | 11/2003 | Kozicki et al. |
| 2003/0212724 A1 | 11/2003 | Ovshinsky et al. |
| 2003/0212725 A1 | 11/2003 | Ovshinsky et al. |
| 2004/0035401 A1 | 2/2004 | Ramachandran et al. |

OTHER PUBLICATIONS

Huggett et al., *Development of silver sensitized germanium selenide photoresist by reactive* sputter etching in $SF_6$, 42 Appl. Phys. Lett., No. 7, pp. 592–594 (Apr. 1983).

Kawaguchi et al., *Mechanism of photosurface deposition,* 164–166 J. Non–Cryst. Solids, pp. 1231–1234 (1993).

Kolobov and Elliott, Photodoping of Amorphous Chalcogenides by Metals, Advances in Physics, vol. 40, No. 5, 625–684 (1991).

Kozicki, et al., "Applications of Programmable Resistance Changes in Metal–doped Chalcogenides", Proceedings of the 1999 Symposium on Solid State Ionic Devices, Editors—E.D. Wachsman et al., The Electrochemical Society, Inc., 1–12 (1999).

Kozicki, et al., *Nanoscale effects in devices based on chalcogenide solid solutions,* Superlattices and Microstructures, 27, 485–488 (2000).

Kozicki, et al., *Nanoscale phase separation in Ag–Ge–Se glasses,* Microelectronic Engineering, vol. 63/1–3, 155–159 (2002).

M.N. Kozicki and M. Mitkova, *Silver incorporation in thin films of selenium rich Ge–Se glasses,* Proceedings of the XIX International Congress on Glass, Society for Glass Technology, 226–227 (2001).

McHardy et al., *The dissolution of metals in amorphous chalcogenides and the effects o electron and ultraviolet radiation,* 20 J. Phys. C.: Solid State Phys., pp. 4055–4075 (1987)f.

Owen et al., *Metal–Chalcogenide Photoresists for High Resolution Lithography and Sub–Micron Structures,* Nanostructure Physics and Fabrication, pp. 447–451 (M. Reed ed. 1989).

Shimizu et al., *The Photo–Erasable Memory Switching Effect of Ag Photo–Doped Chalcogenide Glasses,* 46 B. Chem Soc. Japan, No. 12, pp. 3662–3365 (1973).

Abdel–All, A.; Elshafie,A.; Elhawary, M.M., DC electric–field effect in bulk and thin–film Ge5As38Te57 chalcogenide glass, Vacuum 59 (2000) 845–853.

Adler, D.; Moss, S.C., Amorphous memories and bistable switches, J. Vac. Sci. Technol. 9 (1972) 1182–1189.

Adler, D.; Henisch, H.K.; Mott, S.N., The mechanism of threshold switching in amorphous alloys, Rev. Mod. Phys. 50 (1978) 209–220.

Afifi, M.A.; Labib, H.H.; El–Fazary, M.H.; Fadel, M., Electrical and thermal properties of chalcogenide glass system Se75Ge25–xSbx, Appl. Phys. A 55 (1992) 167–169.

Afifi,M.A.; Labib, H.H.; Fouad, S.S.; El–Shazly, A.A., Electrical & thermal conductivity of the amorphous semiconductor GexSe1–x, Egypt, J. Phys. 17 (1986) 335–342.

Alekperova, Sh.M.; Gadzhieva, G.S., Current–Voltage characteristics of Ag2Se single crystal near the phase transition, Inorganic Materials 23 (1987) 137–139.

Aleksiejunas, A.; Cesnys, A., Switching phenomenon and memory effect in thin–film heterojunction of polycrystalline selenium–silver selenide, Phys. Stat. Sol. (a) 19 (1973) K169–K171.

Angell, C.A., Mobile ions in amorphous solids, Annu. Rev. Phys. Chem. 43 (1992) 693–717.

Aniya, M., Average electronegativity, medium–range–order, and ionic conductivity in superionic glasses, Solid state Ionics 136–137 (2000) 1085–1089.

Asahara, Y.; Izumitani, T., Voltage controlled switching in Cu–As–Se compositions, J. Non–Cryst. Solids 11 (1972) 97–104.

Asokan, S.; Prasad, M.V.N.; Parthasarathy, G.; Gopal, E.S.R., Mechanical and chemical thresholds in IV–VI chalcogenide glasses, Phys. Rev. Lett. 62 (1989) 808–810.

Baranovskii, S.D.; Cordes, H., On the conduction mechanism in ionic glasses, J. Chem. Phys. 111 (1999) 7546–7557.

Belin, R.; Taillades, G.; Pradel, A.; Ribes, M., Ion dynamics in superionic chalcogenide glasses: complete conductivity spectra, Solid state Ionics 136–137 (2000) 1025–1029.

Belin, R.; Zerouale, A.; Pradel, A.; Ribes, M., Ion dynamics in the argyrodite compound Ag7GeSe5I: non–Arrhenius behavior and complete conductivity spectra, Solid State Ionics 143 (2001) 445–455.

Benmore, C.J.; Salmon, P.S., Structure of fast ion conducting and semiconducting glassy chalcogenide alloys, Phys. Rev. Lett. 73 (1994) 264–267.

Bernede, J.C., Influence du metal des electrodes sur les caracteristiques courant–tension des structures M–Ag2Se–M, Thin solid films 70 (1980) L1–L4.

Bernede, J.C., Polarized memory switching in MIS thin films, Thin Solid Films 81 (1981) 155–160.

Bernede, J.C., Switching and silver movements in Ag2Se thin films, Phys. Stat. Sol. (a) 57 (1980) K101–K104.

Bernede, J.C.; Abachi, T., Differential negative resistance in metal/insulator/metal structures with an upper bilayer electrode, Thin solid films 131 (1985) L61–L64.

Bernede, J.C.; Conan, A.; Fousenan't, E.; El Bouchairi, B.; Goureaux, G., Polarized memory switching effects in Ag2Se/Se/M thin film sandwiches, Thin solid films 97 (1982) 165–171.

Bernede, J.C.; Khelil, A.; Kettaf, M.; Conan, A., Transition from S– to N–type differential negative resistance in Al–Al2O3–Ag2–xSe1+x thin film structures, Phys. Stat. Sol. (a) 74 (1982) 217–224.

Bondarev, V.N.; Pikhitsa, P.V., A dendrite model of current instability in RgAg4I5, Solid State Ionics 70/71 (1994) 72–76.

Boolchand, P., The maximum in glass transition temperature (Tg) near x=1/3 in GexSe1–x Glasses, Asian Journal of Physics (2000) 9, 709–72.

Boolchand, P.; Bresser, W.J., Mobile silver ions and glass formation in solid electrolytes, Nature 410 (2001) 1070–1073.

Boolchand, P.; Georgiev, D.G.; Goodman, B., Discovery of the Intermediate Phase in Chalcogenide Glasses, J. Optoelectronics and Advanced Materials, 3 (2001), 703.

Boolchand, P.; Selvanathan, D.; Wang, Y.; Georgiev, D.G.; Bresser, W.J., Onset of rigidity in steps in chalcogenide glasses, Properties and Applications of Amorphous Materials, M.F. Thorpe and Tichy, L. (eds.) Kluwer Academic Publishers, the Netherlands, 2001, pp. 97–132.

Boolchand, P.; Enzweiler, R.N.; Tenhover, M., Structural ordering of evaporated amorphous chalcogenide alloy films: role of thermal annealing, Diffusion and Defect Data vol. 53–54 (1987) 415–420.

Boolchand, P.; Grothaus, J.; Bresser, W.J.; Suranyi, P., Structural origin of broken chemical order in a GeSe2 glass, Phys. Rev. B 25 (1982) 2975–2978.

Boolchand, P.; Grothaus, J.; Phillips, J.C., Broken chemical order and phase separation in GexSe1–x glasses, Solid state comm. 45 (1983) 183–185.

Boolchand, P., Bresser, W.J., Compositional trends in glass transition temperature (Tg), network connectivity and nanoscale chemical phase separation in chalcogenides, Dept. of ECECS, Univ. Cincinnati (Oct. 28, 1999) 45221–0030.

Boolchand, P.; Grothaus, J, Molecular Structure of Melt–Quenched GeSe2 and GeS2 glasses compared, Proc. Int. Conf. Phys. Semicond. (Eds. Chadi and Harrison) $17^{th}$ (1985) 833–36.

Bresser, W.; Boolchand, P.; Suranyi, P., Rigidity percolation and molecular clustering in network glasses, Phys. Rev. Lett. 56 (1986) 2493–2496.

Bresser, W.J.; Boolchand, P.; Suranyi, P.; de Neufville, J.P, Intrinsically broken chalcogen chemical order in stoichiometric glasses, Journal de Physique 42 (1981) C4–193–C4–196.

Bresser, W.J.; Boolchand, P.; Suranyi, P.; Hernandez, J.G., Molecular phase separation and cluster size in GeSe2 glass, Hyperfind Interactions 27 (1986) 389–392.

Cahen, D.; Gilet, J.–M.; Schmitz, C.; Chernyak, L.; Gartsman, K.; Jakubowicz, A., Room–Temperature, electric field induced creation of stable devices in CuInSe2 Crystals, Science 258 (1992) 271–274.

Chatterjee, R.; Asokan, S.; Titus, S.S.K., Current–controlled negative–resistance behavior and memory switching in bulk As–Te–Se glasses, J. Phys. D: Appl. Phys. 27 (1994) 2624–2672.

Chen, C.H.; Tai, K.L. , Whisker growth induced by Ag photodoping in glassy GexSe1–x films, Appl. Phys. Lett. 37 (1980) 1075–1077.

Chen, G.; Cheng, J., Role of nitrogen in the crystallization of silicon nitride–doped chalcogenide glasses, J. Am. Ceram. Soc. 82 (1999) 2934–2936.

Chen, G.; Cheng, J.; Chen, W., Effect of Si3N4 on chemical durability of chalcogenide glass, J. Non–Cryst. Solids 220 (1997) 249–253.

Cohen, M.H.; Neale, R.G.; Paskin, A., A model for an amorphous semiconductor memory device, J. Non–Cryst. Solids 8–10 (1972) 885–891.

Croitoru, N.; Lazarescu, M.; Popescu, C.; Telnic, M.; and Vescan, L., Ohmic and non–ohmic conduction in some amorphous semiconductors, J. Non–Cryst. Solids 8–10 (1972) 781–786.

Dalven, R.; Gill, R., Electrical properties of beta–Ag2Te and beta–Ag2Se from 4.2 to 300K, J. Appl. Phys. 38 (1967) 753–756.

Davis, E.A., Semiconductors without form, Search 1 (1970) 152–155.

Dearnaley, G.; Stoneham, A.M.; Morgan, D.V., Electrical phenomena in amorphous oxide films, Rep. Prog. Phys. 33 (1970) 1129–1191.

Dejus, R.J.; Susman, S.; Volin, K.J.; Montague, D.G.; Price, D.L., Structure of Vitreous Ag–Ge–Se, J. Non–Cryst. Solids 143 (1992) 162–180.

den Boer, W., Threshold switching in hydrogenated amorphous silicon, Appl. Phys. Lett. 40 (1982) 812–813.

Drusedau, T.P.; Panckow, A.N.; Klabunde, F., The hydrogenated amorphous silicon/nanodisperse metal (SIMAL) system–Films of unique electronic properties, J. Non–Cryst. Solids 198–200 (1996) 829–832.

El Bouchairi, B.; Bernede, J.C.; Burgaud, P., Propeties of Ag2–xSe1+x/n–Si diodes, Thin Solid Films 110 (1983) 107–113.

El Gharras, Z.; Bourahla, A.; Vautier, C., Role of Photoinduced defects in amorphous GexSe1−x photoconductivity, J. Non–Cryst. Solids 155 (1993) 171–179.

El Ghrandi, R.; Calas, J.; Galibert, G.; Averous, M., Silver photodissolution in amorphous chalcogenide thin films, Thin Solid Films 218 (1992)259–273.

El Ghrandi, R.; Calas, J.; Galibert, G., Ag dissolution kinetics in amorphous GeSe5.5 thin films from "in–situ" resistance measurements vs time, Phys. Stat. Sol. (a) 123 (1991) 451–460.

El–kady, U.L., The threshold switching in semiconducting glass Ge21Se17Te62, Indian J. Phys. 70a (1996) 507–516.

Elliott, S.R., A unified mechanism for metal photodissolution in amorphous chalcogenide materials, J. Non–Cryst. Solids 130 (1991) 85–97.

Elliott, S.R., Photodissolution of metals in chalcogenide glasses: A Unified mechanism, J. Non–Cryst. Solids 137–138 (1991) 1031–1034.

Elsamanoudy, M.M.; Hegab, N.A.; Fadel, M., Conduction mechanism in the pre–switching state of thin films containing Te As Ge Si, Vacuum 46 (1995) 701–707.

El–Zahed, H.; El–Korashy, A., Influence of composition on the electrical and optical properties of Ge20BixSe80−x films, Thin Solid Films 376 (2000) 236–240.

Fadel, M., Switching phenomenon in evaporated Se–Ge–As thin films of amorphous chalcogenide glass, Vacuum 44 (1993) 851–855.

Fadel, M.; El–Shari, H.T., Electrical, thermal and optical properties of Se75Ge7Sb18, Vacuum 43 (1992) 253–257.

Feng, X. ;Bresser, W.J.; Boolchand, P., Directed evidence for stiffness threshold in Chalcogenide glasses, Phys. Rev. Lett. 78 (1997) 4422–4425.

Feng, X.; Bresser, W.J.; Zhang, M.; Goodman, B.; Boolchand, P., Role of network connectivity on the elastic, plastic and thermal behavior of covalent glasses, J. Non–Cryst. Solids 222 (1997) 137–143.

Fischer–Colbrie, A.; Bienenstock, A.; Fuoss, P.H.; Marcus, M.A., Structure and bonding in photodiffused amorphous Ag–GeSe2 thin films, Phys. Rev. B 38 (1988) 12388–12403.

Fleury, G.; Hamou, A.; Viger, C.; Vautier, C., Conductivity and crystallization of amorphous selenium, Phys. Stat. Sol. (a) 64 (1981) 311–316.

Fritzsche, H, Optical and electrical energy gaps in amorphous semiconductors, J. Non–Cryst. Solids 6 (1971) 49–71.

Fritzsche, H., Electronic phenomena in amorphous semiconductors, Annual Review of Materials Science 2 (1972) 697–744.

Gates, B.; Wu, Y.; Yin, Y.; Yang, P.; Xia, Y., Single–crystalline nanowires of Ag2Se can be synthesized by templating against nanowires of trigonal Se, J. Am. Chem. Soc. (2001) curently ASAP.

Gosain, D.P.; Nakamura, M.; Shimizu, T.; Suzuki, M.; Okano, S., Nonvolatile memory based on reversible phase transition phenomena in telluride glasses, Jap. J. Appl. Phys 28 (1989) 1013–1018.

Guin, J.–P.; Rouxel, T.; Keryvin, V.; Sangleboeuf, J.–C.; Serre, I.; Lucas, J., Indentation creep of Ge–Se chalcogenide glasses below Tg: elastic recovery and non–Newtonian flow, J. Non Cryst. Solids 298 (2002) 260–269.

Guin, J.–P.; Rouxel, T.; Sangleboeuf, J.–C; Melscoet, I.; Lucas, J., Hardness, toughness and scratchability of germanium–selenium chalcogenide glasses, J. Am. Ceram. Soc. 85 (2002) 1545–52.

Gupta, Y.P., On electrical switching and memory effects in amorphous chalcogenides, J. Non–Cryst. Sol. 3 (1970) 148–154.

Haberland, D.R.; Stiegler, H., New experiments on the charge–controlled switching effect in amorphous semiconductors, J. Non–Cryst. Solids 8–10 (1972) 408–414.

Haifz, M.M.; Ibrahim, M.M.; Dongol, M.; Hammad, F.H., Effect of composition on the strucure and electrical properties of As–Se–Cu glasses, J. Apply. Phys. 54 (1983) 1950–1954.

Hajto, J.; Rose, M.J.; Osborne, I.S.; Snell, A.J.; Le Comber, P.G.; Owen A.E. Quantization effects in metal/a–Si:H/metal devices, Int. J. Electronics 73 (1992) 911–913.

Hajto, J.; Hu, J.; Snell, A.J.; Turvey, K.; Rose, M., DC and AC measurements on metal/a–Si:H/metal room temperature quantised resistance devices, J. Non–Cryst. Solids 266–269 (2000) 1058–1061.

Hajto, J.; McAuley, B.; Snell, A.J.; Owen, A.E., Theory of room temperature quantized resistance effects in metal–a–Si:H–metal thin film structuress, J. Non–Cryst. Solids 198–200 (1996) 825–828.

Hajto, J.; Owen, A.E.; Snell, A.J.; Le Comber, P.G.; Rose, M.J., Analogue memory and ballistic electron effects in metal–amorphous silicon structures, Phil. Mag. B 63 (1991) 349–369.

Hayashi, T.; Ono, Y.; Fukaya, M.; Kan, H., Polarized memory switching in amorphous Se film, Japan. J. Appl. Phys 13 (1974) 1163–1164.

Hegab, N.A.; Fadel, M.; Sedeek, K., Memory switching pehnomena in thin films of chalcogenide semiconductors, Vacuum 45 (1994) 459–462.

Hirose, Y.; Hirose, H., Polarity–dependent memory switching and behavior of Ag dendrite in Ag–photodoped amorphous As2S3 films, J. Appl. Phys. 47 (1976) 2767–2772.

Hong, K.S.; Speyer, R.F., Switching behavior in II–IV–V2 amorphous semiconductor systems, J. Non–Cryst. Solids 116 (1990) 191–200.

Hosokawa, S., Atomic and electronic structures of glassy GexSe1−x around the stiffness threshold composition, J. Optoelectroncis and Advanced Materials 3 (2001) 199–214.

Hu, J.; Snell, A.J.; Hajto, J.; Owen, A.E., Constant current forming in Cr/p+a−/Si:H/V thin film devices, J. Non–Cryst. Solids 227–230 (1998) 1187–1191.

Hu, J.; Hajto, J.; Snell, A.J.; Owen, A.E.; Rose, M.J., Capacitance anomaly near the metal–non–metal transition in Cr–hydrogenated amorphous Si–V thin–film devices, Phil. Mag. B. 74 (1996) 37–50.

Hu, J.; Snell, A.J.; Hajto, J.; Owen, A.E., Current–induced instability in Cr–p+a–Si:H–V thin film devices, Phil. Mag. B80 (2000) 29–43.

Iizima, S.; Sugi, M.; Kikuchi, M.; Tanaka, K., Electrical and thermal properties of semiconducting glasses As–Te–Ge, Solid State Comm. 8 (1970) 153–155.

Ishikawa, R.; Kikuchi, M., Photovoltaic study on the photo–enhanced diffusion of Ag in amorphous films of Ge2S3, J. Non–Cryst. Solids 35 & 36 (1980) 1061–1066.

Iyetomi, H.; Vashishta, P.; Kalia, R.K., Incipient phase separation in Ag/Ge/Se glasses: clustering of Ag atoms, J. Non–Cryst. Solids 262 (2000) 135–142.

Jones, G.; Collins, R.A., Switching properties of thin selenium films under pulsed bias, Thin Solid Films 40 (1977) L15–L18.

Joullie, A.M.; Marucchi, J., On the DC electrical conduction of amorphous As2Se7 before switching, Phys. Stat. Sol. (a) 13 (1972) K105–K109.

Joullie, A.M.; Marucchi, J., Electrical properties of the amorphous alloy As2Se5, Mat. Res. Bull 8 (1973) 433–442.

Kaplan, T.; Adler, D., Electrothermal switching in amorphous semiconductors. J. Non–Cryst. Solids 8–10 (1972) 538–543.

Kawaguchi, T.; Maruno, S.; Elliott, S.R., Optical, electrical, and structural properties of amorphous Ag–Ge–S and Ag–Ge–Se films and comparison of photoinduced and thermally induced phenomena of both systems, J. Appl. Phys. 79 (1996) 9096–9104.

Kawaguchi, T.; Masui, K., Analysis of change in optical transmission spectra resulting from Ag ph todoping in chalcogenide film, Japn. J. Appl. Phys. 26 (1987) 15–21.

Kawasaki, M.; Kawamura, J.; Nakamura, Y.; Aniya, M., Ionic conductivity of Agx(GeSe3)1–x (0<=x<=0.571) glasses, Solid state Ionics 123 (1999) 259–269.

Kluge, G.; Thomas, A.; Klabes, R.; Grotzschel, R., Silver photodiffusion in amorphous GexSe100–x, J. Non–Cryst. Solids 124 (1990) 186–193.

Kolobov, A.V., On the origin of p–type conductivity in amorphous chalcogenides, J. Non–Cryst. Solids 198–200 (1996) 728–731.

Kolobov, A.V., Lateral diffusion of silver in vitreous chalcogenide films, J. Non–Cryst. Solids 137–138 (1991) 1027–1030.

Korkinova, Ts.N.; Andreichin,R.E., Chalocogenide glass polarization and the type of contacts, J. Non–Cryst. Solids 194 (1996) 256–259.

Kotkata, M.F.; Afif, M.A.; Labib, H.H.; Hegab, N.A.; Abdel–Aziz, M.M., Memory switching in amorphous GeSeTl chalcogenide semiconductor films, Thin Solid Films 240 (1994) 143–146.

Lakshminarayan, K.N.; Srivastava, K.K.; Panwar, O.S.; Dumar. A., Amorphous semiconductor devices: memory and switching mechanism, J. Instn Electronics & Telecom. Engrs 27 (1981) 16–19.

Lal, M.; Goyal N., Chemical bond approach to study the memory and threshold switching chalcogenide glasses, Indian Journal of pure & appl. phys. 29 (1991) 303–304.

Leimer, F.; Stotzel, H.; Kottwitz, A., Isothermal electrical polarisation of amorphous GeSe films with blocking Al contacts influenced by Poole–Frenkel conduction, Phys. Stat. Sol. (a) 29 (1975) K129–K132.

Leung, W.; Cheung, N.; Neureuther, A.R., Photoinduced diffusion of Ag in GexSe1–x glass, Appl. Phys. Lett., 46 (1985) 543–545.

Matsushita, T.; Yamagami, T.; Okuda, M., Polarized memory effect observed on Se–SnO2 system, Jap. J. Appl. Phys. 11 (1972) 1657–1662.

Matsushita, T.; Yamagami, T.; Okuda, M., Polarized memory effect observed on amorphous selenium thin films Jpn. J. Appl. Phys. 11 (1972) 606.

Mazurier, F.; Levy, M.; Souquet, J.L, Reversible and irreversible electrical switching in TeO2–V205 based glasses, Journal de Physique IV 2 (1992) C2–185–C2–188.

Messoussi, R.; Bernede, J.C.; Benhida, S.; Abachi, T.; Latef. A., Electrical characterization of M/Se structures (M=Ni, Bi), Mat. Chem. And Phys 28 (1991) 253–258.

Mitkova, M.; Boolchand, P., Microscopic origin of the glass forming tendency in chalogenides and constraint theory, J. Non–Cryst. Solids 240 (1998) 1–21.

Mitkova, M.; Kozicki, M.N., Silver incorporation in Ge–Se glasses used in programmable metallization cell devices, J. Non–Cryst. Solids 299–302 (2002) 1023–1027.

Mitokova, M.; Wang, Y.; Boolchand, P., Dual chemical role of Ag as an additive in chalcogenide glasses, Phys. Rev. Lett. 83 (1999) 3848–3851.

Miyatani, S.–y., Electronic and ionic conduction in (AgxCu1–x)2Se, J. Phys. Soc. Japan 34 (1973) 423–432.

Miyatani, S.–y., Electrical properties of Ag2Se, J. Phys. Soc. Japan 13 (1958) 317.

Miyatani, S.–y., Ionic conduction in beta–Ag2Te and beta–Ag2Se, Journal Phys. Soc. Japan 14 (1959) 996–1002.

Mott, N.F., Conduction in glasses containing transition metal ions, J. Non–Cryst. Solids 1 (1968) 1–17.

Nakayama, K.; Kitagawa, T.; Ohmura, M.; Suzuki, M., Nonvolatile memory based on phase transitions in chalcogenide thin films, Jpn. J. Appl. Phys 32 (1993) 564–569.

Nakayama, K.; Kojima, K.; Hayakawa, F.; Imai, Y.; Kitagawa, A.; Suzuki, M., Submicron nonvolatile memory cell based on reversible phase transition in chalcogenide glasses, Jpn. J. Appl. Phys. 39 (2000) 6157–6161.

Nang, T.T.; Okuda, M.; Matsushita, T.; Yokota, S.; Suzuki, A., Electrical and optical parameters of GexSe1–x amorphous thin films, Jap. J. App. Phys 15 (1976) 849–853.

Narayanan, R.A.; Asokan, S.; Kumar, A., Evidence concerning the effect of topology on electrical switching in chalcogenide network glasses, Phys. Rev. B54 (1996) 4413–4415.

Neale, R.G.; Aseltine, J.A., The application of amorphous materials to computer memories, IEEE transactions on electron dev. Ed–20 (1973) 195–209.

Ovshinsky S.R.; Fritzsche, H., Reversible structural transformations in amorphous semiconductors for memory and logic, Mettalurgical transactions 2 (1971) 641–645.

Ovshinsky, S.R., Reversible electrical switching phenomena in disordered structures, Phys. Rev. Lett. 21 (1968) 1450–1453.

Owen, A.E.; LeComber, P.G.; Sarrabayrouse, G.; Spear, W.E., New amorphous–silicon electrically programmable nonvolatile switching device, IEE Proc. 129 (1982) 51–54.

Owen, A.E.; Firth, A.P.; Ewen, P.J.S., Photo–induced structural and physico–chemical changes in amorphous chalcogenide semiconductors, Phil. Mag. B 52 (1985) 347–362.

Owen, A.E.; Le Comber, P.G.; Hajto, J.; Rose, M.J.; Snell, A.J., Switching in amorphous devices, Int. J. Electronics 73 (1992) 897–906.

Pearson, A.D.; Miller, C.E., Filamentary conduction in semiconducting glass diodes, App. Phys. Lett. 14 (1969) 280–282.

Pinto, R.; Ramanathan, K.V., Electric field induced memory switching in thin films of the chalcogenide system Ge–As–Se, Appl. Phys. Lett. 19 (1971) 221–223.

Popescu, C., The effect of local non–uniformities on thermal switching and high field behavior of structures with chalcogenide glasses, Solid–state electronics 18 (1975) 671–681.

Popescu, C.; Croitoru, N., The contribution of the lateral thermal instability to the switching phenomenon, J. Non–Cryst. Solids 8–10 (1972) 531–537.

Popov, A.I; Geller, I.KH.; Shemetova, V.K., Memory and threshold switching effects in amorphous selenium, Phys. Stat. Sol. (a) 44 (1977) K71–K73.

Prakash, S.; Asokan, S.; Ghare, D.B., Easily reversible memory switching in Ge–As–Te glasses, J. Phys. D: Appl. Phys 29 (1996) 2004–2008.

Rahman, S.; Silvarama Sastry, G., Electronic switching in Ge–Bi–Se–Te glasses, Mat. Sci. and Eng. B12 (1992) 219–222.

Ramesh, K.; Asokan. S.; Sangunni, K.S.; Gopal, E.S.R., Electrical Switching in germanium telluride glasses doped with Cu and Ag, Appl. Phys. A 69 (1999) 421–425.

Rose,M.J.;Hajto,J.;Lecomber,P.G.;Gage,S.M.;Choi,W.K.; Snell,A.J.;Owen, A.E., Amorphous silicon analogue memory devices, J. Non–Cryst. Solids 115 (1989) 168–170.

Rose, M.J.;Snell,A.J.;Lecomber,P.G.;Hajto,J.;Fitzgerald, A.G.;Owen,A.E., Aspects of non–volatility in a–Si:H Memory devices, Mat. Res. Soc. Symp. Proc. V 258, 1992, 1075–1080.

Schuocker, D.; Rieder, G., On the reliability of amorphous chalcogenide switching devices, J. Non–Cryst. Solids 29 (1978) 397–407.

Sharma, A.K.; Singh. B., Electrical conductivity measurements of evaporated selenium films in vacuum, Proc. Indian Natn. Sci. Acad. 46, A, (1980) 362–368.

Sharma, P., Structural, electrical and optical properties of silver selenide films, Ind. J. Of pure and applied phys. 35 (1997) 424–427.

Snell, A.J.; Lecomber, P.G.; Hajto, J.; Rose, M.J.; Owen, A.E.; Osborne, I.L., Analogue memory effects in metal/a–Si:H/metal memory devices, J. Non–Cryst. Solids 137–138 (1991) 1257–1262.

Snell, A.J.; Hajto, J.;Rose, M.J.; Osborne, L.S.; Holmes, A.; Owen, A.E.; Gibson, R.A.G., Analogue memory effects in metal/a–Si:H/metal thin film structures, Mat. Res. Soc. Symp. Proc. V 297, 1993, 1017–1021.

Steventon, A.G., Microfilaments in amorphous chalcogenide memory devices, J. Phys. D: Appl. Phys 8 (1975) L120–L122.

Steventon, A.G., The switching mechanism in amorphous chalcogenide memory devices, J. Non–Cryst. Solids 21 (1976) 319–329.

Stocker, H.J., Bulk and thin film switching and memory effects in semiconducting chalcogenide glasses, App. Phys. Lett. 15 (1969) 55–57.

Tanaka, K., Ionic and mixed conductions in Ag photodoping process, Mod. Phys. Lett B 4 (1990) 1373–1377.

Tanaka, K.; Iizima, S.; Sugi, M.; Okada, Y.; Kikuchi, M., Thermal effects on switching phenomenon in chalcogenide amorphous semiconductors, Solid State Comm. 8 (1970) 387–389.

Thornburg, D.D., Memory switching in a Type I amorphous chalcogenide, J. Elect. Mat. 2 (1973) 3–15.

Thornburg, D.D., Memory switching in amorphous arsenic triselenide, J. Non–Cryst. Solids 11 (1972) 113–120.

Thornburg, D.D.; White, R.M., Electric field enhanced phase separation and memory switching in amorphous arsenic triselenide, Journal(??) (1972) 4609–4612.

Tichy, L.; Ticha, H., Remark on the glass–forming ability in GexSe1–x and AsxSe1–x systems, J. Non–Cryst. Solids 261 (2000) 277–281.

Titus, S.S.K.; Chatterjee, R.; Asokan, S., Electrical switching and short–range order in As–Te glasses, Phys. Rev. B 48 (1993) 14650–14652.

Tranchant,S.;Peytavin,S.;Ribes,M.;Flank,A.M.;Dexpert, H.;Lagarde,J.P., Silver chalcogenide glasses Ag–Ge–Se: Ionic conduction and exafs structural investigation, Transport–structure relations in fast ion and mixed conductors Proceedings of the 6th Riso International symposium. Sep. 9–13, 1985.

Tregouet, Y.; Bernede, J.C., Silver movements in Ag2Te thin films: switching and memory effects, Thin Solid Films 57 (1979) 49–54.

Uemura, O.; Kameda, Y.; Kokai, S.; Satow, T., Thermally induced crystallization of amorphous Ge0.4Se0.6, J. Non–Cryst. Solids 117–118 (1990) 219–221.

Uttecht, R.; Stevenson, H.; Sie, C.H.; Griener, J.D.; Raghavan, K.S., Electric field induced filament formation in As–Te–Ge glass, J. Non–Cryst. Solids 2 (1970) 358–370.

Viger, C.; Lefrancois, G.; Fleury, G., Anomalous behaviour of amorphous selenium films, J. Non–Cryst. Solids 33 (1976) 267–272.

Vodenicharov, C.; Parvanov,S.; Petkov, P., Electrode–limited currents in the thin–film M–GeSe–M system, Mat. Chem. And Phys. 21 (1989) 447–454.

Wang, S.–J.; Misium, G.R.; Camp, J.C.; Chen, K.–L.; Tigelaar, H.L., High performance Metal/sillicide antifuse, IEEE electron dev. Lett. 13 (1992)471–472.

Weirauch, D.F., Threshold switching and thermal filaments in amorphous semiconductors, App. Phys. Lett. 16 (1970) 72–73.

West, W.C.; Sieradzki, K.; Kardynal, B.; Kozicki, M.N., Equivalent circuit modeling of the Ag|As0.24S0.36Ag0.40|Ag System prepares by photodissolution of Ag, J. Electrochem. Soc. 145 (1998) 2971–2974.

West, W.C., Electrically erasable non–volatile memory via electrochemical deposition of multifractal aggregates, Ph.D. Dissertation, ASU 1998.

Zhang, M.; Mancini, S.; Bresser, W.; Boolchang, P., Variation of glass transition temperature, Tg, with average coordination number, <m>, in network glasses: evidence of a threshold behavior in the slope |dTg/d<m>| at the rigidity percolation threshold (<m>=2.4), J. Non–Cryst. Solids 151 (1992) 149–154.

P. Boolchand, et al.—"Onset of Rigidity in Steps in Chalcogenide Glasses" Properties and Applications of Amorphous Materials, pgs. 118–124.

Yoji Kawamoto et al.—"Ionic Conduction in $As_2S_3$–$Ag_2S$, $GeS_2$Ges–$Ag_2S$ and $P_2S_5$–$Ag_2S$ Glasses," Journal of Non–Crystalline Solids 20 (1976), pgs. 393–404.

Michael N. Kozicki, 1. Programmable Metallization Cell Technology Description, Feb. 18, 2000.

Michael N. Kozicki, Axon Technologies Corp. and Arizona State University, Presentation to Micron Technology, Inc., Apr. 6, 2000.

* cited by examiner

METHOD TO ALTER CHALCOGENIDE GLASS FOR IMPROVED SWITCHING CHARACTERISTICS

FIELD OF THE INVENTION

The present invention relates to the field of random access memory (RAM) devices formed using a resistance variable material, and in particular to a resistance variable memory element having improved switching characteristics.

BACKGROUND OF THE INVENTION

A well known semiconductor component is semiconductor memory, such as a random access memory (RAM). RAM permits repeated read and write operations on memory elements. Typically, RAM devices are volatile, in that stored data is lost once the power source is disconnected or removed. Non-limiting examples of RAM devices include dynamic random access memory (DRAM), synchronized dynamic random access memory (SDRAM) and static random access memory (SRAM). In addition, DRAMS and SDRAMS also typically store data in capacitors which require periodic refreshing to maintain the stored data.

In recent years, the number and density of memory elements in memory devices have been increasing. Accordingly, the size of each element has been shrinking, which in the case of DRAMs also shortens the element's data holding time. Typically, a DRAM memory device relies on element capacity for data storage and receives a refresh command in a conventional standardized cycle, about every 100 milliseconds. However, with increasing element number and density, it is becoming more and more difficult to refresh all memory elements at least once within a refresh period. In addition, refresh operations consume power.

Recently resistance variable memory elements, which includes programmable conductor memory elements, have been investigated for suitability as semi-volatile and non-volatile random access memory elements. Kozicki et al. in U.S. Pat. Nos. 5,761,115; 5,896,312; 5,914,893; and 6,084,796, discloses a programmable conductor memory element including an insulating dielectric material formed of a chalcogenide glass disposed between two electrodes. A conductive material, such as silver, is incorporated into the dielectric material. The resistance of the dielectric material can be changed between high resistance and low resistance states. The programmable conductor memory is normally in a high resistance state when at rest. A write operation to a low resistance state is performed by applying a voltage potential across the two electrodes. The mechanism by which the resistance of the element is changed is not fully understood. In one theory suggested by Kozicki et al., the conductively-doped dielectric material undergoes a structural change at a certain applied voltage with the growth of a conductive dendrite or filament between the electrodes effectively interconnecting the two electrodes and setting the memory element in a low resistance state. The dendrite is thought to grow through the resistance variable material in a path of least resistance.

The low resistance state will remain intact for days or weeks after the voltage potentials are removed. Such material can be returned to its high resistance state by applying a reverse voltage potential between the electrodes of at least the same order of magnitude as used to write the element to the low resistance state. Again, the highly resistive state is maintained once the voltage potential is removed. This way, such a device can function, for example, as a resistance variable memory element having two resistance states, which can define two logic states.

One preferred resistance variable material comprises a chalcogenide glass. A specific example is germanium-selenide ($Ge_xSe_{100-x}$) comprising silver (Ag). One method of providing silver to the germanium-selenide composition is to initially form a germanium-selenide glass and then deposit a thin layer of silver upon the glass, for example by sputtering, physical vapor deposition, or other known technique in the art. The layer of silver is irradiated, preferably with electromagnetic energy at a wavelength less than 600 nanometers, so that the energy passes through the silver and to the silver/glass interface, to break a chalcogenide bond of the chalcogenide material such that the glass is doped with silver. Silver may also be provided to the glass by processing the glass with silver, as in the case of a silver-germanium-selenide glass. Another method for providing metal to the glass is to provide a layer of silver-selenide on a germanium-selenide glass.

The mean coordination number of the glass defines the tightness of the glass matrix. If the chalcogenide glass matrix is tight, then a larger resistance change is inhibited when a memory element switches from an on to an off state. On the other hand, if the chalcogenide glass matrix is looser (more open), then a larger resistance change is more easily facilitated. Accordingly, glasses having an open matrix, e.g., a larger resistance change, require a longer time to write when reprogrammed to the low resistance state. Conversely, glasses having a tight matrix, e.g. inhibiting large resistance changes, will write to the low resistance state faster.

Although glasses having an open matrix may comprise silver, it would be advantageous to use a silver containing glass having a tight matrix. However, a disadvantage of using a tight matrix glass is that it is difficult to provide silver to the glass and achieve good switching.

Silver can be directly incorporated into a resistance variable material having an open matrix, such as $Ge_{20}Se_{80}$ or $Ge_{23}Se_{77}$ to form silver-selenide within the $Ge_xSe_{100-x}$ backbone. The $Ge_xSe_{100-x}$ backbone, however, is lacking the Se that went into forming the silver-selenide. The remaining glass backbone does not have a mean coordinator number corresponding to a tight matrix, like $Ge_{40}Se_{60}$. As a consequence, there is greater Ag mobility causing a larger resistance change when a memory element is programmed back to its high resistance state.

It would be desirable to have a chalcogenide glass memory element comprising silver and which also has a tight glass matrix to inhibit metal migration thus allowing the memory element to retain memory longer and inhibiting a large resistance change when the memory element is programmed back to its high resistance state.

BRIEF SUMMARY OF THE INVENTION

In its structure aspect, the invention provides a metal containing resistance variable material having a tighter more rigid glass matrix, which exhibits improved switching characteristics and data retention.

The invention also provides a $Ge_xSe_{100-x}$ glass memory element incorporating silver therein and which has a tighter more rigid glass matrix.

In its method aspect, the invention provides a method in which a metal is incorporated into a resistance variable material and then the metal containing resistance variable material is annealed to provide a tighter more rigid glass matrix.

In a more specific aspect, the invention provides a method in which a silver-germanium-selenide glass is annealed to provide a tighter more rigid glass matrix.

BRIEF DESCRIPTION OF THE DRAWINGS

These and other features and advantages of the invention will be better understood from the following detailed description, which is provided in connection with the accompanying drawings.

DETAILED DESCRIPTION OF THE INVENTION

Figure 1:
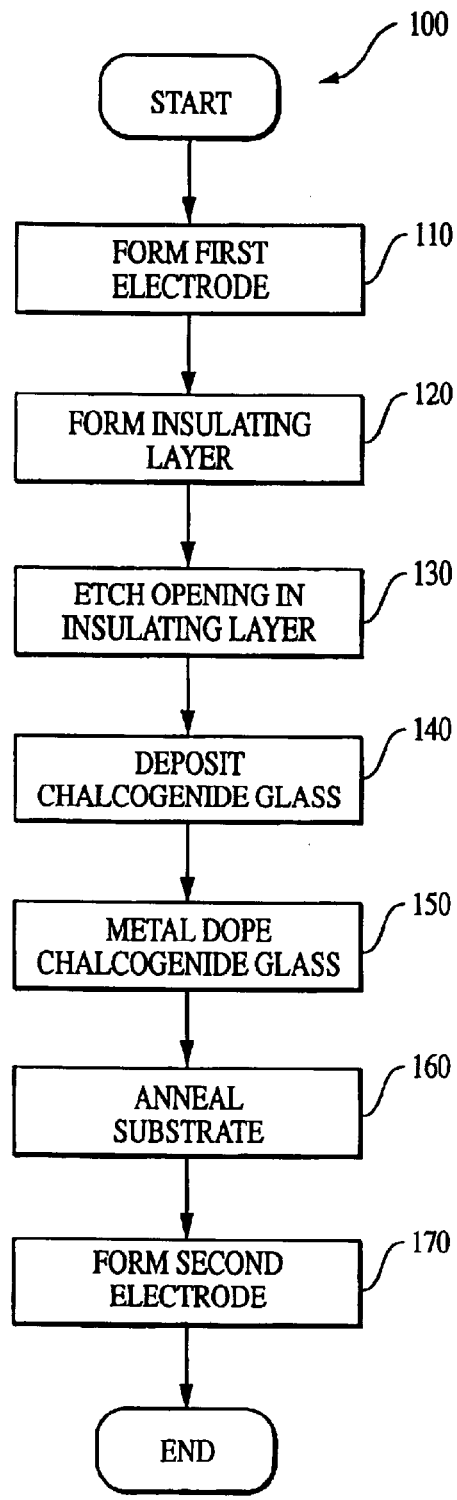
FIG. 1 illustrates a process according to an embodiment of the present invention.

In the following detailed description, reference is made to various specific structural and process embodiments of the invention. These embodiments are described with sufficient detail to enable those skilled in the art to practice the invention. It is to be understood that other embodiments may be employed, and that various structural, logical and electrical changes may be made without departing from the spirit or scope of the invention.

The term "substrate" used in the following description may include any supporting structure including but not limited to a semiconductor substrate that has an exposed substrate surface. Structure should be understood to include silicon-on-insulator (SOI), silicon-on-sapphire (SOS), doped and undoped semiconductors, epitaxial layers of silicon supported by a base semiconductor foundation, and other semiconductor structures. When reference is made to a substrate or wafer in the following description, previous process steps may have been utilized to form regions or junctions in or over the base semiconductor or foundation.

The term "silver" is intended to include not only elemental silver, but silver with other trace metals or in various alloyed combinations with other metals as known in the semiconductor industry, as long as such silver alloy is conductive, and as long as the physical and electrical properties of the silver remain unchanged.

The term "silver-selenide" is intended to include various species of silver-selenide, including some species which have a slight excess or deficit of silver, for instance, $Ag_2Se$, $Ag_{2+x}Se$, and $Ag_{2-x}Se$.

The term "semi-volatile memory device" is intended to include any memory device which is capable of maintaining its memory state after power is removed from the device for a prolonged period of time. Thus, semi-volatile memory devices are capable of retaining stored data after the power source is disconnected or removed. The term "semi-volatile memory device" as used herein includes not only semi-volatile memory devices, but also non-volatile memory devices.

The term "resistance variable material" is intended to include chalcogenide glasses, and chalcogenide glasses comprising a metal, such as silver. For instance the term "resistance variable material" includes silver doped chalcogenide glasses, silver-germanium-selenide glasses, and chalcogenide glasses comprising a silver selenide layer.

The term "resistance variable memory element" is intended to include any memory element, including programmable conductor memory elements, semi-volatile memory elements, and non-volatile memory elements which exhibit a resistance change in response to an applied voltage.

The present invention relates to a method of forming a resistance variable memory element having improved switching characteristics and to the resulting memory element.

Applicants have discovered that the tightness and hence rigidity of the glass matrix of a chalcogenide glass used in a resistance variable memory element determines the speed at which a memory elements switches. For instance, if the memory element erases to a larger or higher resistance, the memory element will write more slowly than if the memory element erases to a smaller or lower resistance. The tightness of the glass matrix is generally characterized by the mean coordination of the glass. Boolchand et al. in *Onset of Rigidity in Steps in Chalcogenide Glass*, Properties and Applications of Amorphous Materials, pp. 97–132, (2001), the disclosure of which is incorporated by reference herein, observes a floppy to rigid transition in $Ge_xSe_{100-x}$ glasses that occurs when x=0.23 (x being the germanium molar concentration). Raman scattering and Temperature Modulated Differential Scanning Calorimetric (MDSC) measurements have shown that a stiffness threshold occurs at a mean coordination number of r=2.46. Thus a glass having a stoichiometry greater than about $Ge_{23}S_{77}$ or a mean coordination number of about 2.46 or greater is rigid. Glasses characterized as rigid are stiff and have a rigid network or closed matrix type structure. Lower rigidity glasses, i.e., glasses having an open matrix, include glasses having a stoichiometric range of about $Ge_{20}Se_{80}$ to about $Ge_{23}Se_{77}$.

Applicants have further discovered that glasses having a rigid network structure inhibit larger resistance changes, resulting in memory elements which can be reprogrammed to a low resistance state relatively faster, thusly having shorter write cycles and better switching characteristics.

In accordance with the invention, silver is incorporated into a lower rigidity glass, such as for example $Ge_{20}Se_{80}$ to $Ge_{23}Se_{77}$. Then the silver containing glass is annealed, preferably by heating, to produce a more rigid glass. The silver containing glass is also preferably annealed in the presence of oxygen. Annealing drives off a portion of the selenium in the glass and raises the germanium to selenium ratio. It is known that the higher the germanium to selenium ratio, the more tightly packed the glass matrix and the more rigid the structure. Accordingly, a memory element formed of the annealed glass switches faster than conventionally formed glasses.

Typical temperatures for packaging of memory elements are of about 170° C. to about 190° C. (e.g., for encapsulation) and can be as high as 230° C. (e.g., for wire bonding). Typical processing steps during the fabrication of resistance variable memory elements, for example photoresist and/or nitride deposition processes, can also take place at temperatures of about 200° C. Generally acceptable chalcogenide glass compositions for resistance variable memory elements have a glass transition temperature, which is about or higher than the highest packaging and/or processing temperatures used during the formation of the memory device or of the packaging of the memory device itself. For instance, $Ge_{40}Se_{60}$ glass has a bulk material glass transition temperature of about 347° C. It is believed that the thin-film, as opposed to the bulk material, transition temperature of the backbone may be slightly higher than the transition temperature of the bulk resistance variable material. Accordingly, to prevent glass transition, the resistance variable material thin-film is annealed at temperatures close to or slightly below the thin-film glass transition temperature of the resistance variable material.

Figure 2:
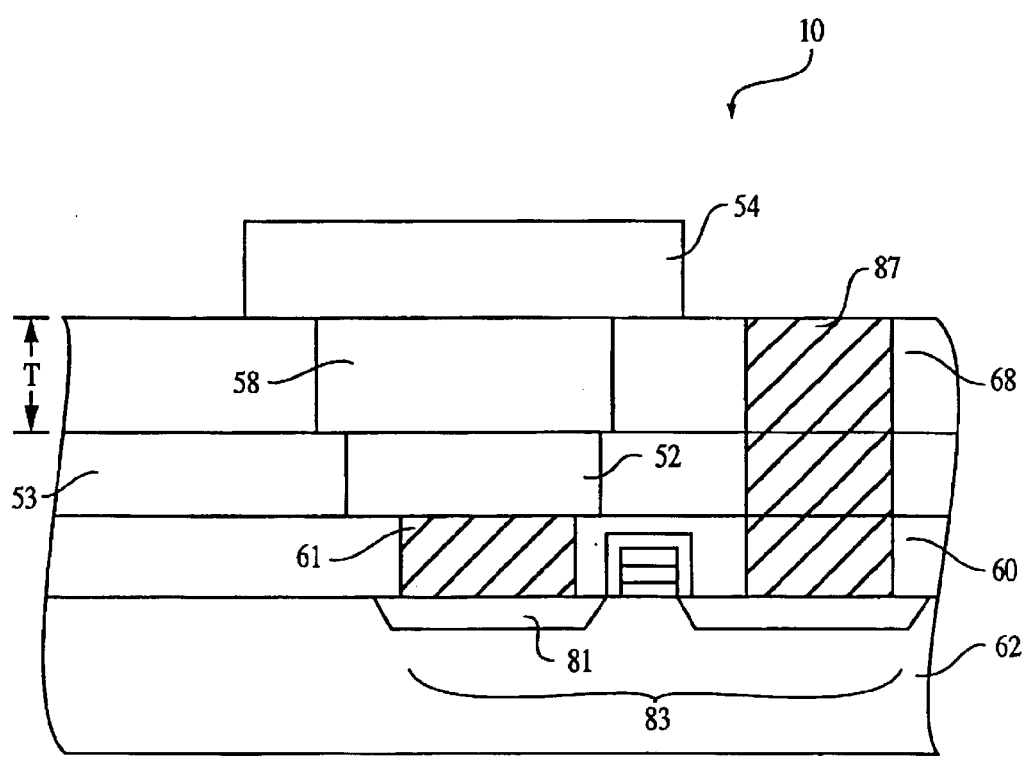
FIG. 2 is a cross-sectional view of a resistance variable memory element constructed in accordance with the process of FIG. 1.

FIG. 1 illustrates a process 100 according to an exemplary embodiment of the method of the invention. While FIG. 2 depicts one exemplary structure formed in accordance with the process of FIG. 1.

Refer now to FIG. 1 at process segment 110 a first electrode is formed over a substrate assembly. The material used to form the electrode can be selected from a variety of conductive materials, for example, tungsten, nickel, tantalum, titanium, titanium nitride, aluminum, platinum, or silver, among many others.

Next, at process segment 120, an insulating layer is formed in contact with the first electrode. This and any other subsequently formed insulating layers may be formed of a conventional insulating nitride or oxide, among others. The present invention is not limited, however, to the above-listed materials and other insulating and/or dielectric materials known in the industry may be used. The insulating layer may be formed by any known deposition methods, for example, by sputtering, chemical vapor deposition (CVD), plasma enhanced CVD (PECVD) or physical vapor deposition (PVD), among others.

In the next process segment 130, the insulating layer is etched to form an opening, which exposes the first electrode. Subsequently, in process segment 140, a resistance variable material is deposited into the opening. The resistance variable material is deposited in such a manner so as to contact the first electrode. In an exemplary embodiment, the resistance variable material is a germanium-selenide glass. The germanium-selenide glass composition is of a relatively low rigidity, such as one having a $Ge_xSe_{100-x}$ stoichiometry of from about $Ge_{20}Se_{80}$ to about $Ge_{23}Se_{77}$. The resistance variable material may be deposited by any known deposition methods, for example, by sputtering, chemical vapor deposition (CVD), plasma enhanced CVD (PECVD) or physical vapor deposition (PVD). The resistance variable material may be formed over the first electrode to dimensions (i.e., length, thickness, and width) suitable to produce desired electrical characteristics of the memory element.

In process segment 150, a metal, such as silver, is incorporated into the resistance variable material. For a $Ge_xSe_{100-x}$ glass where x=20 to 23, silver (Ag) is preferably incorporated into the resistance variable material. One technique for incorporating silver into a germanium-selenide glass is by processing the glass with silver to form silver-germanium-selenide. Another technique for incorporating silver into a resistance variable material is doping. The resistance variable material may be doped by first coating the material with a layer of silver, for example, by sputtering, and then driving the silver into the material with UV radiation. Alternatively, the silver can be co-sputtered with the resistance variable material composition to produce a doped resistance variable material. Silver may also be incorporated into the resistance variable material by providing silver as a separate layer, for instance, a silver-selenide (silver-selenide) layer provided on a germanium-selenide glass.

In process segment 160, the resistance variable material backbone is annealed. The backbone may be annealed at this point in processing, preferably by heating the substrate assembly. However, the backbone may be annealed at any suitable time during fabrication of the resistance variable memory element. A suitable annealing temperature is an elevated temperature close to or slightly below the thin-film glass transition temperature of the resistance variable material. A preferred range of elevated annealing temperatures for a germanium-selenide glass backbone, is from about 200° C. to about 330° C. The substrate is preferably annealed for about 5 to about 15 minutes, and more pref erably about 10 minutes. The substrate is also preferably annealed in an atmosphere comprising oxygen. Annealing the substrate drives off some selenium from the germanium-selenide glass. The loss of selenium in the glass backbone changes the stoichiometry of the glass increasing the relative amount of germanium and providing a more rigid glass.

After annealing, in process segment 170, a second metal electrode is formed in contact with the silver-germanium-selenide glass. As noted, the annealing step can be performed at any time during the fabrication and/or packaging of the memory element, provided suitable annealing temperatures as noted above are present.

The structure produced by one implementation of the exemplary process described with reference to FIG. 1 is shown in FIG. 2 in the context of a random access memory device. However, it should be understood that the invention may be used in other types of memory devices. Also, other embodiments may be used and structural or logical changes may be made to the described and illustrated embodiment without departing from the spirit or the scope of the present invention.

FIG. 2 illustrates an exemplary construction of a resistance variable memory element. A resistance variable memory element 10 in accordance with the present invention is generally fabricated over a semiconductor substrate 62 and comprises a first insulating layer 60 formed over a substrate 62 in and on which may be fabricated access circuitry for operating a resistance variable memory element as part of a memory array of such elements. The insulating layer 60 contains a conductive plug 61. In accordance with process segment 110, a first metal electrode 52 is formed within a second insulating layer 53 provided over the insulating layer 60 and plug 61. In accordance with process segment 120, a third insulating layer 68 is formed over the first electrode 52 and second insulating layer 53. In accordance with process segment 130, an etched opening is provided for depositing a chalcogenide glass 58 in the opening of the third insulating layer 68.

Following through to process segment 140, the chalcogenide glass 58 is deposited in the opening and in contact with the first electrode 52. In accordance with process segment 150, a metal, preferably silver, is incorporated into the chalcogenide glass. As described, the glass may be a silver-germanium-selenide glass, or the metal may be provided in numerous different ways, including incorporation into the glass by doping the glass with a metal dopant. The metal dopant preferably comprises silver.

In accordance with process segment 160, the glass 58 backbone is subsequently annealed to drive off selenium from the silver-germanium-selenide glass and form a more rigid glass structure. Next, according to process segment 170, a second metal electrode 54 is formed in contact with the silver-germanium-selenide glass 58.

The third insulating layer 68 may be formed, for example, between the first electrode 52 and the second electrode 54 of any suitable insulator, for example a nitride, an oxide, or other insulator. The third insulating layer 68 may be formed by any known deposition method, for example, by sputtering, chemical vapor deposition (CVD), plasma enhanced CVD (PECVD) or physical vapor deposition (PVD), among others. The third insulating layer 68 may comprise an insulating material that provides a diffusion barrier for metals, such as silver. A preferred insulating material is silicon nitride, but those skilled in the art will appreciate that there are other numerous suitable insulating materials for this purpose. The thickness T of the third insulating layer 68 and chalcogenide glass 58 is in the range of from about 100 Angstroms to about 10,000 Angstroms and is preferably about 500 Angstroms.

As noted, the chalcogenide glass 58 is preferably a germanium-selenide composition comprising silver and having a Ge/Se stoichiometry of from about $Ge_{20}Se_{80}$ to about $Ge_{23}Se_{77}$. However, the invention may also be carried out with other chalcogenide glasses having other metals incorporated therein, as long as the glass is annealed to increase its rigidity.

The first electrode 52 may also be electrically connected to a source/drain region 81 of an access transistor 83, which is fabricated within and on substrate 62. Another source/drain region 85 may be connected by a bit line plug 87 to a bit line of a memory array. The gate of the transistor 83 may be part of a word line which is connected to a plurality of resistance variable memory elements just as a bit line (not shown) may be coupled to a plurality of resistance variable memory elements through respective access transistors. The bit line may be formed over a fourth insulating layer (not shown) and may be formed of any conductive material, for example, a metal. The bit line connects to the bit line plug 87, which in turn connects with access transistor 83.

Although FIG. 2 illustrates the formation of only one resistance variable memory element 10, it should be understood that the present invention contemplates the formation of any number of such resistance variable memory elements, which can be formed within one or more memory element arrays.

Figure 3:
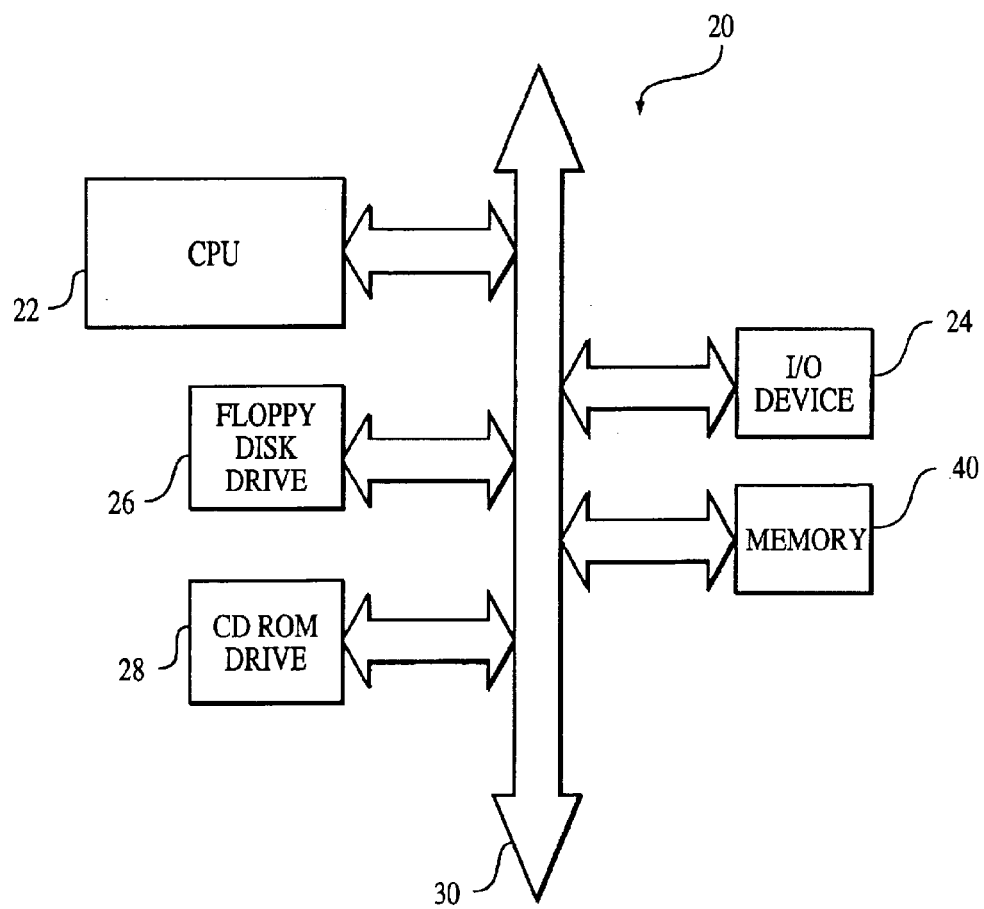
FIG. 3 illustrates a computer system having one or more memory devices that contains resistance variable memory elements according to the present invention.

FIG. 3 illustrates a processor system 20 which includes a memory circuit 40. e.g., a memory device, which employs resistance variable memory elements 10 (FIG. 2) according to the invention. The processor system 20, which can be, for example, a computer system, generally comprises a central processing unit (CPU) 22, such as a microprocessor, a digital signal processor, or other programmable digital logic devices, which communicates with an input/output (I/O) device 24 over a bus 30. The memory circuit 40 communicates with the CPU 22 over bus 30 typically through a memory controller.

In the case of a computer system, the processor system 20 may include peripheral devices such as a floppy disk drive 26 and a compact disc (CD) ROM drive 28, which also communicate with CPU 22 over the bus 30. Memory circuit 40 is preferably constructed as an integrated circuit, which includes one or more resistance variable memory elements, e.g., devices 10 (FIG. 1). If desired, the memory circuit 40 may be combined with the processor, for example CPU 22, in a single integrated circuit.

The above description and drawings are only to be considered illustrative of exemplary embodiments, which achieve the features and advantages of the present invention. Modification and substitutions to specific process conditions and structures can be made without departing from the spirit and scope of the present invention. Accordingly, the invention is not to be considered as being limited by the foregoing description and drawings, but is only limited by the scope of the appended claims.

What is claimed as new and desired to be protected by Letters Patent of the United States is:

1. A method of fabricating a resistance variable memory element, comprising the steps of:
   forming a layer of a resistance variable material; and
   subsequently increasing the rigidity of said resistance variable material by annealing said resistance variable material in an atmosphere comprising oxygen.

2. The method of claim 1 wherein said step of annealing comprises heating said resistance variable material to a temperature of about or below a thin-film glass transition temperature of said resistance variable material.

3. The method of claim 1 wherein said step of annealing comprises the step of heating said resistance variable material to a temperature ranging from about 200° C. to about 330° C. for a time period ranging from about 5 to about 15 minutes.

4. The method of claim 3 wherein said time period is about 10 minutes.

5. The method of claim 1 wherein said resistance variable material comprises a germanium-selenide glass.

6. The method of claim 5 wherein said germanium-selenide glass has a stoichiometry between about $Ge_{20}Se_{80}$ and about $Ge_{23}Se_{77}$.

7. The method of claim 5 wherein said germanium-selenide glass has a germanium molar concentration number of equal to or less than about 0.23.

8. The method of claim 1 wherein after increasing the rigidity, said resistance variable material has a mean coordination number of at least about 2.46.

9. A method of fabricating a resistance variable element, comprising the steps of:
   forming a layer of germanium-selenide glass;
   incorporating silver into said germanium-selenide glass layer to form a silver-germanium-selenide glass; and
   processing said silver-germanium-selenide glass to remove at least some selenium from said silver-germanium-selenide glass.

10. The method of claim 9 wherein said step of processing comprises heating said silver-germanium-selenide glass to a temperature at or below a thin-film glass transition temperature of said silver-germanium-selenide glass.

11. The method of claim 10 wherein said step of heating is performed in an atmosphere comprising oxygen.

12. The method of claim 10 wherein after said step of heating said silver-germanium-selenide glass, said silver-germanium-selenide glass has a mean coordination number of at least about 2.46.

13. The method of claim 9 wherein said processing comprises annealing said silver-germanium-selenide glass at a temperature ranging from about 200° C. to about 330° C. for a time period ranging from about 5 to about 15 minutes.

14. The method of claim 13 wherein said time period is about 10 minutes.

15. The method of claim 9 wherein said germanium-selenide glass layer has a stoichiometry range from between about $Ge_{20}Se_{80}$ and about $Ge_{23}Se_{77}$.

16. The method of claim 9 wherein said germanium-selenide glass layer has a germanium molar concentration number of about 0.23 or less prior to said processing.

17. The method of claim 9 wherein after removing at least some selenium from said silver-germanium-selenide glass, said silver-germanium-selenide glass has a germanium molar concentration number greater than about 0.23.

18. A method of forming a resistance variable memory element comprising the steps of:
   forming a first electrode;
   forming an insulating layer over said first electrode;
   etching an opening in said insulating layer to expose said first electrode;
   depositing a resistance variable material in said opening;
   adding a metal to said resistance variable material to form a metal containing resistance variable material;
   increasing the rigidity of said metal containing resistance variable material by changing the stoichiometry of said resistance variable material; and forming a second metal electrode in contact with said metal containing resistance variable material.

19. The method of claim 18 wherein said step of increasing rigidity comprises annealing said metal containing resistance variable material.

20. A method of forming a resistance variable memory element comprising the steps of:
forming a first electrode;
forming an insulating layer over said first electrode;
etching an opening in said insulating layer to expose said first electrode;
depositing a resistance variable material in said opening;
adding a metal to said resistance variable material to form a metal containing resistance variable material;
increasing the rigidity of said metal containing resistance variable material by annealing said metal containing resistance variable material in an atmosphere comprising oxygen; and
forming a second metal electrode in contact with said metal containing resistance variable material.

21. The method of claim 19 wherein said step of annealing comprises the step of heating said metal containing resistance variable material to a temperature at or below a thin-film glass transition temperature of said metal containing resistance variable material.

22. The method of claim 19 wherein said step of annealing comprises the step of heating said metal containing resistance variable material to a temperature ranging from about 200° C. to about 330° C. for a time period ranging from about 5 to about 15 minutes.

23. The method of claim 22 wherein said time period is about 10 minutes.

24. The method of claim 18 wherein after said step of increasing the rigidity, said metal containing resistance variable material has a mean coordination number of at least about 2.46.

25. The method of claim 18 wherein said resistance variable material comprises a germanium-selenide composition.

26. A method of forming a resistance variable memory element comprising the steps of:
forming a first electrode;
forming an insulating layer over said first electrode;
etching an opening in said insulating layer to expose said first electrode;
depositing a resistance variable material comprising a germanium-selenide composition in said opening;
adding a metal to said resistance variable material to form a metal containing resistance variable material;
increasing the rigidity of said metal containing resistance variable material by removing at least some selenium from said germanium-selenide composition; and
forming a second metal electrode in contact with said metal containing resistance variable material.

27. A method of forming a resistance variable memory element comprising the steps of:
forming a first electrode;
forming an insulating layer over said first electrode;
etching an opening in said insulating layer to expose said first electrode;
depositing a resistance variable material comprising a germanium-selenide composition in said opening;
adding a metal to said resistance variable material to form a metal containing resistance variable material;
increasing the rigidity of said metal containing resistance variable material by changing the stoichiometry of said germanium-selenide composition; and
forming a second metal electrode in contact with said metal containing resistance variable material.

28. The method of claim 25 wherein said germanium-selenide composition has a stoichiometry range between about $Ge_{20}Se_{80}$ and about $Ge_{23}Se_{77}$.

29. The method of claim 25 wherein said germanium-selenide composition has a germanium molar concentration number of about 0.23 or less prior to said increasing step.

30. A method of forming a resistance variable memory element comprising the steps of:
forming a first electrode;
forming an insulating layer over said first electrode;
etching an opening in said insulating layer to expose said first electrode;
depositing a resistance variable material comprising a germanium-selenide composition in said opening;
adding a metal to said resistance variable material to form a metal containing resistance variable material;
increasing the rigidity of said metal containing resistance variable material, said germanium-selenide composition having a germanium molar concentration of greater than about 0.23 after said increasing step; and
forming a second metal electrode in contact with said metal containing resistance variable material.

* * * * *

UNITED STATES PATENT AND TRADEMARK OFFICE
CERTIFICATE OF CORRECTION

PATENT NO. : 6,867,064 B2  
DATED : March 15, 2005  
INVENTOR(S) : Kristy A. Campbell et al.

Page 1 of 1

It is certified that error appears in the above-identified patent and that said Letters Patent is hereby corrected as shown below:

Title page,
Item [56], References Cited, U.S. PATENT DOCUMENTS, "5,335,519 A 8/1994 Bernie" should read -- 5,335,219 8/1994 Ovshinsky et al. --
OTHER PUBLICATIONS, "El Bouchairi, B.; Bernede, J.C.; reference, "El Bouchairi, B.; Bernede, J.C.; Burgaud, P., Properties of Ag2-xSe1+x/n-Si diodes, Thin Solid Films 110 (1983) 107-113." should read -- El Bourchairi,B; Bernede, J.C.; Burgaud, P., Properties of Ag2-xSe1+x/n-Si diodes, Thin Solid Films 110 (1983) 107-113. --
"Feng, X.; Bresser," reference "Feng, X.; Bresser, W.J.; Boolchand, P., Directed evidence for stiffness threshold in Chalcogenide glasses, Phys, Rev. Lett. 78 (1997) 4422-4425." should read -- Feng, X.; Bresser, W.J.; Boolchand, P., Direct evidence for stiffness threshold in chalcogenide glasses, Phys. Rev. Lett. 78 (1997) 4422-4425. --
"Hosokawa, S., reference, " Hosokawa, S., Atomic and electronic structures of glassy GexSel-x around the stiffness threshold composition, J. Optoelectroncis and Advanced Materials 3 (2001) 199-214." should read -- Hosokawa, S., Atomic and electronic structures of glassy GexSe1-x around the stiffness threshold compositon, J. Optoelectronics and Advanced Materials 3 (2001) 199-214. --
"Mitokova, M.; Wang, Y Boolchand, P.," reference Dual chemical role of Ag as an additive in chalgenide glasses Phys. Rev. Lett. 83 (1999) 3848-3851." should read -- Mitkova, M.; Wang, Y.; Boolchand, P., Dual chemical role of Ag as an additive in chalcogenide glasses, Phys. Rev. Lett. 83 (1999) 3848- 3851. --
"Yoji Kowamoto et al." reference, "Ionic Conduction in $As_2S_3$-$Ag_2S$,$GeS_2$Ges-$Ag_2S$ and $P_2S_5$-$Ag_2S$ Glasses," Journal of Non-Crystalline Solids 20 (1976), pgs. 393-404." should read -- Yoji Kawamoto et al.,-"Ionic Conduction in $As_2S_3$-$Ag_2S$,$GeS_5$ GeS-$Ag_2S$ and $P_2S_5$-$Ag_2S$ Glasses," Journal of Non-Crystalline Solids 20 (1976), pgs. 393-404. --

Signed and Sealed this

Twenty-eighth Day of June, 2005

JON W. DUDAS  
*Director of the United States Patent and Trademark Office*

UNITED STATES PATENT AND TRADEMARK OFFICE
CERTIFICATE OF CORRECTION

PATENT NO. : 6,867,064 B2  Page 1 of 1
DATED : March 15, 2005
INVENTOR(S) : Kristy A. Campbell et al.

It is certified that error appears in the above-identified patent and that said Letters Patent is hereby corrected as shown below:

Title page,
Item [56], References Cited, U.S. PATENT DOCUMENTS, "5,335,519 A 8/1994 Bernie" should read -- 5,335,219 8/1994 Ovshinsky et al. --
OTHER PUBLICATIONS, "El Bouchairi, B.; Bernede, J.C.; reference, "El Bouchairi, B.; Bernede, J.C.; Burgaud, P., Properties of Ag2-xSel+x/n-Si diodes, Thin Solid Films 110 (1983) 107-113." should read -- El Bourchairi,B; Bernede, J.C.; Burgaud, P., Properties of Ag2-xSe1+x/n-Si diodes, Thin Solid Films 110 (1983) 107-113. --
"Feng, X.; Bresser," reference "Feng, X.; Bresser, W.J.; Boolchand, P., Directed evidence for stiffness threshold in Chalcogenide glasses, Phys, Rev. Lett. 78 (1997) 4422-4425." should read -- Feng, X.; Bresser, W.J.; Boolchand, P., Direct evidence for stiffness threshold in chalcogenide glasses, Phys. Rev. Lett. 78 (1997) 4422-4425. --
"Hosokawa, S., reference, " Hosokawa, S., Atomic and electronic structures of glassy GexSel-x around the stiffness threshold composition, J. Optoelectroncis and Advanced Materials 3 (2001) 199-214." should read -- Hosokawa, S., Atomic and electronic structures of glassy GexSe1-x around the stiffness threshold compositon, J. Optoelectronics and Advanced Materials 3 (2001) 199-214. --
"Mitokova, M.; Wang, Y Boolchand, P.," reference Dual chemical role of Ag as an additive in chalgenide glasses Phys. Rev. Lett. 83 (1999) 3848-3851." should read -- Mitkova, M.; Wang, Y.; Boolchand, P., Dual chemical role of Ag as an additive in chalcogenide glasses, Phys. Rev. Lett. 83 (1999) 3848- 3851. --
"Yoji Kowamoto et al." reference, "Ionic Conduction in $As_2S_3$-$Ag_2S$,$GeS_2$Ges-$Ag_2S$ and $P_2S_5$-$Ag_2S$ Glasses," Journal of Non-Crystalline Solids 20 (1976), pgs. 393-404." should read -- Yoji Kawamoto et al.,-"Ionic Conduction in $As_2S_3$-$Ag_2S$,$GeS_2$ GeS-$Ag_2S$ and $P_2S_5$-$Ag_2S$ Glasses," Journal of Non-Crystalline Solids 20 (1976), pgs. 393-404. --.

This certificate supersedes Certificate of Correction issued June 28, 2005.

Signed and Sealed this

Eleventh Day of October, 2005

JON W. DUDAS
*Director of the United States Patent and Trademark Office*